United States Patent
Khor et al.

(10) Patent No.: US 11,855,019 B2
(45) Date of Patent: Dec. 26, 2023

(54) METHOD OF FORMING A SENSOR DEVICE

(71) Applicant: GLOBALFOUNDRIES Singapore Pte. Ltd., Singapore (SG)

(72) Inventors: Ee Jan Khor, Singapore (SG); Juan Boon Tan, Singapore (SG); Ramasamy Chockalingam, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 305 days.

(21) Appl. No.: 17/173,237

(22) Filed: Feb. 11, 2021

(65) Prior Publication Data
US 2022/0252534 A1 Aug. 11, 2022

(51) Int. Cl.
*H01L 23/00* (2006.01)
*G01N 27/22* (2006.01)

(52) U.S. Cl.
CPC .......... *H01L 24/05* (2013.01); *G01N 27/225* (2013.01); *H01L 24/03* (2013.01); *H01L 24/06* (2013.01); *H01L 2224/02206* (2013.01); *H01L 2224/0382* (2013.01)

(58) Field of Classification Search
CPC .... G01N 27/225; G01N 27/223; H01L 24/03; H01L 24/05; H01L 2224/022; H01L 2224/0382; H01L 23/3192; H01L 2224/0391; H01L 2224/04042; H01L 2224/05546; H01L 2224/05567; H01L 2224/05647; H01L 24/06
See application file for complete search history.

(56) References Cited

U.S. PATENT DOCUMENTS

| | | | |
|---|---|---|---|
| 6,445,565 B1 | 9/2002 | Toyoda et al. | |
| 7,554,134 B2 | 6/2009 | Cummins | |
| 8,357,958 B2 | 1/2013 | Cummins | |
| 9,606,079 B2 * | 3/2017 | Merz | G01N 27/4145 |
| 9,941,222 B2 * | 4/2018 | Daamen | B81C 1/00246 |
| 10,175,188 B2 | 1/2019 | O'Brien et al. | |
| 2013/0187275 A1 * | 7/2013 | Ohira | H01L 23/481 |
| | | | 257/762 |

FOREIGN PATENT DOCUMENTS

CN 105510404 A * 4/2016 ........... G01N 27/223

* cited by examiner

*Primary Examiner* — Michael Jung
(74) *Attorney, Agent, or Firm* — Anthony Canale

(57) ABSTRACT

The disclosed subject matter relates generally to methods of forming a semiconductor device, such as a moisture sensor. A plurality of electrodes and a bond pad are formed in a dielectric region. A passivation layer is formed on each electrode in the plurality of electrodes and the bond pad. A barrier layer is formed on the passivation layer. A plurality of trenches are formed to extend through the barrier layer and into the dielectric region. Formation of the trenches simultaneously exposes an upper surface of the bond pad. A moisture sensitive dielectric layer is formed on the barrier layer. Formation of the moisture sensitive dielectric layer also fills the trenches to form a plurality of projections, each projection being formed between two electrodes in the plurality of electrodes.

10 Claims, 11 Drawing Sheets

METHOD OF FORMING A SENSOR DEVICE

FIELD OF THE INVENTION

The disclosed subject matter relates generally to methods of forming a semiconductor device, such as a moisture sensor. More particularly, the present disclosure relates to a method of forming a sensor device and a bond pad in the same dielectric region. The present disclosure also relates to the semiconductor devices formed by the method disclosed herein.

BACKGROUND

Humidity sensors are widely used in various fields to measure the amount of water vapor present in the air of a particular environment. Humidity sensors are often configured as capacitive sensor devices that use capacitance to measure humidity. Capacitive humidity sensors may typically include a pair of electrodes separated by a dielectric material. The dielectric layer may be formed of a material configured to absorb and retain water molecules at concentrations that are proportional to the ambient humidity. The water molecules alter the dielectric constant of the material resulting in a change in capacitance between the two electrodes. Using this property of the material, the humidity can be determined by measuring the capacitance between the two electrodes and correlating the measured capacitance to a corresponding humidity value.

Conventional humidity sensors may be fabricated on a surface of a processed wafer (e.g., after back-end-of-line processing). Such sensors can have a large footprint on the surface of the wafer which limits the ability to incorporate humidity sensors into other devices without increasing the size of the integrated circuit (IC) chip. As a result, separate chips and separate processing steps are typically required to fabricate capacitive humidity sensors, and special packaging methods are required to incorporate them into other devices.

SUMMARY

In an aspect of the present disclosure, there is provided a method of forming a semiconductor device by forming a plurality of electrodes in a dielectric region, forming a barrier layer over the electrodes, forming a plurality of trenches that extend through the barrier layer and into the dielectric region, and forming a moisture sensitive dielectric layer on the barrier layer, in which the forming of the moisture sensitive dielectric layer also fills the trenches to form a plurality of projections, each projection being formed between two electrodes in the plurality of electrodes.

In another aspect of the present disclosure, there is provided a method of forming a semiconductor device by forming a plurality of electrodes and a bond pad in a dielectric region, in which the plurality of electrodes is located in a first device region and the bond pad is located in a second device region, forming a barrier layer over the electrodes and the bond pad, forming a plurality of trenches that extend through the barrier layer and into the dielectric region, the forming of the trenches simultaneously exposing an upper surface of the bond pad, and forming a moisture sensitive dielectric layer on the barrier layer and the exposed upper surface of the bond pad, in which the forming of the moisture sensitive dielectric layer also fills the trenches to form a plurality of projections, each projection being formed between two electrodes in the plurality of electrodes.

In yet another aspect of the present disclosure, there is provided a semiconductor device having a dielectric region, a plurality of electrodes in the dielectric region, a passivation layer on upper surfaces of the electrodes, a barrier layer on the passivation layer, a moisture sensitive dielectric layer on the barrier layer, and a plurality of projections integrally formed with the moisture sensitive dielectric layer, the projections extending into the dielectric region, in which each projection is between two electrodes in the plurality of electrodes.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1:
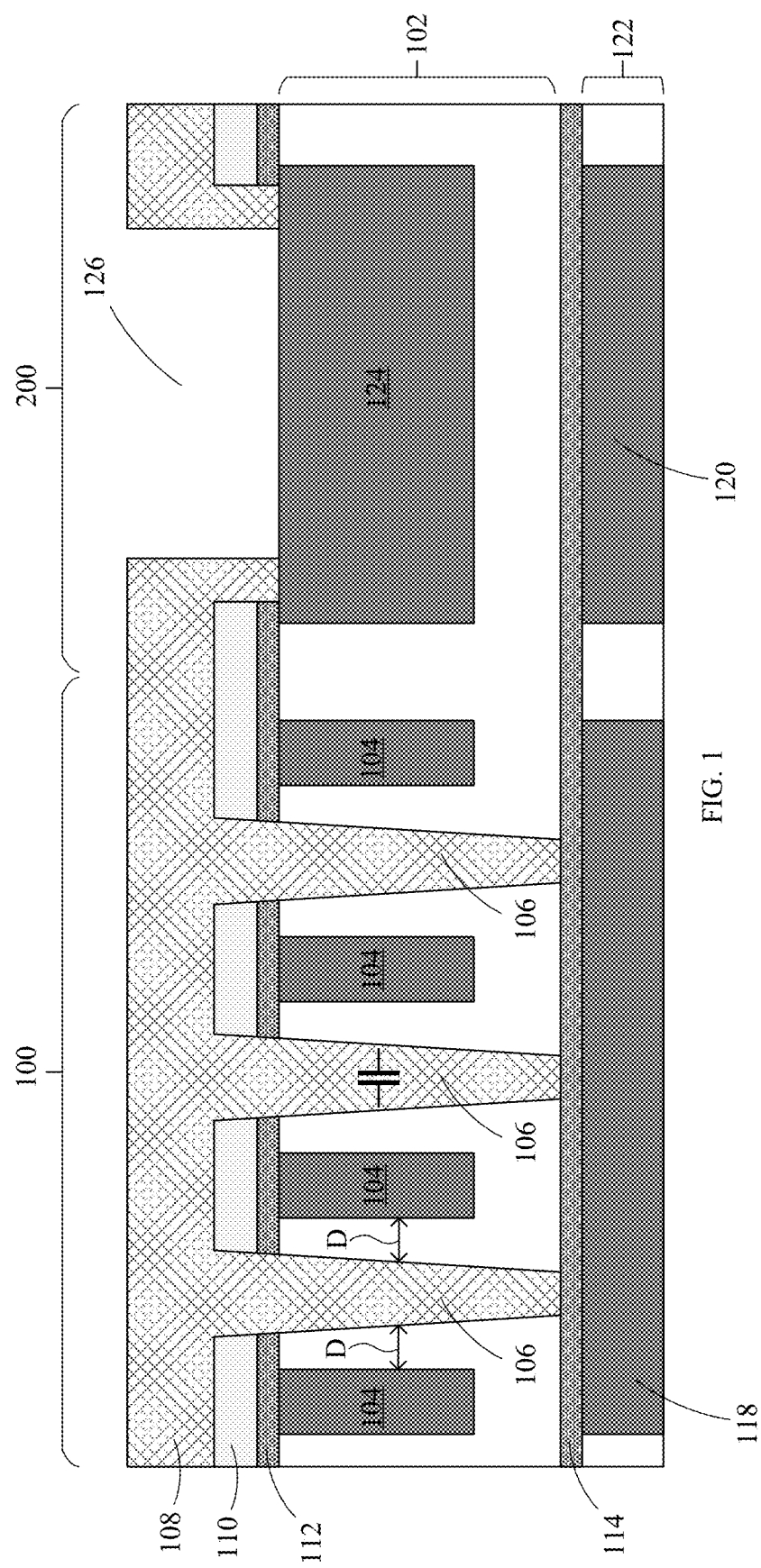
FIG. 1 is a cross-sectional view of an example of a semiconductor device for use as a moisture sensor.

Referring to FIG. 1, a semiconductor device for use in sensing applications (e.g., a moisture sensor) includes a first dielectric region 102, a plurality of electrodes 104 in the first dielectric region 102, a barrier layer 110 over the electrodes 104, and a moisture sensitive dielectric layer 108 on the barrier layer 110. A plurality of projections 106 is integrally formed with the moisture sensitive dielectric layer 108, in which the projections 106 extend into the first dielectric region 102. Each projection 106 is between two electrodes in the plurality of electrodes 104.

A passivation layer 112 may be disposed between the barrier layer 110 and the electrodes 104. The passivation layer 112 may be formed on upper surfaces of the electrodes 104 and may serve to prevent physical and/or chemical damage to the electrodes 104 and an upper surface of the semiconductor device. In an embodiment, the barrier layer 110 and the passivation layer 112 may be formed to cover only the upper surfaces of the electrodes 104. The passivation layer 112 may be made of a dielectric material such as, but not limited to, silicon nitride (SiN), or Nitrogen doped silicon carbide (SiCN), SiC$_x$H$_z$ (i.e., BLoK™), or SiN$_w$C$_x$H$_z$ (i.e., NBLoK™), wherein each of w, x, y, and z independently has a value greater than 0 and less than 0.75.

The moisture sensitive dielectric layer 108 and the projections 106 may be made of a dielectric material that has a dielectric constant that changes as a function of relative humidity. For example, the moisture sensitive dielectric layer 108 may include a hygroscopic organic polymer, such as, but not limited to, polyimide, or cellulose acetate butyrate.

Moisture sensing of the semiconductor device may be based on the capacitance between two electrodes in the plurality of electrodes 104. For example, the dielectric constant of each projection 106 between the two electrodes may change in response to the water content in the material of the projection 106, which in turn alters the capacitance (represented by a capacitor symbol illustrated in FIG. 1) between the two electrodes. Hence, the ambient moisture may be accurately determined by converting the capacitance between the two electrodes 104 to a corresponding electrical signal with a detection circuit (not shown). The detection circuit may be electrically connected to the plurality of electrodes 104 and may be integrated into the semiconductor device or formed separately.

The barrier layer 110 may serve as a barrier to prevent the moisture sensitive dielectric layer 108 from directly contacting the electrode 104. Advantageously, the barrier layer 110 may prevent the ingress of moisture or diffusion of water molecules from the moisture sensitive dielectric layer 108 into the electrodes 104, which may otherwise cause corrosion to the electrodes 104 and deteriorate the performance of the semiconductor device. The barrier layer 110 may be made of a material such as, but not limited to, silicon dioxide, tetraethyl orthosilicate (TEOS), or a material having a chemical composition of SiC$_x$O$_y$H$_z$, wherein x, y, and z are in stoichiometric ratio.

The first dielectric region 102 may be formed above a second dielectric region 122. An etch stop layer 114 may be formed between the first dielectric region 102 and the second dielectric region 122. The etch stop layer 114 may include a material such as, but not limited to, silicon nitride (SiN), or Nitrogen doped silicon carbide (SiCN), SiC$_x$H$_z$ (i.e., BLoK™), or SiN$_w$C$_x$H$_z$ (i.e., NBLoK™), wherein each of w, x, y, and z independently has a value greater than 0 and less than 0.75.

The dielectric regions 102, 122 may be formed above a semiconductor substrate (not shown) which may be made of any semiconductor material, such as silicon, germanium, silicon germanium (SiGe), silicon carbide, III-V compound semiconductors (e.g., GaAs), or II-VI compound semiconductors (e.g., ZnSe). The dielectric regions 102, 122 may be inter-metal dielectric (IMD) layers or a "metallization level" that embeds various interconnect features, electrodes, bond pads, or conductive structures. For example, the second dielectric region 122 may include interconnect structures 118, 120. The interconnect structures 118, 120 may be made of copper, aluminum, cobalt, or an alloy thereof. The dielectric regions 102, 122 may include a dielectric material such as, but not limited to, silicon dioxide, tetraethyl orthosilicate (TEOS), or a material having a chemical composition of SiC$_x$O$_y$H$_z$, wherein x, y, and z are in stoichiometric ratio. In particular, the first dielectric region 102 may include a material with the same etch selectivity as the material in the barrier layer 110. Preferably, the first dielectric region 102 and the barrier layer 110 may be made of the same material.

Each projection 106 may be separated from each electrode 104 by the material of the first dielectric region 102. For example, as shown in FIG. 1, the projections 106 may be laterally spaced apart from the electrodes 104 by a distance D. Advantageously, the material of the first dielectric region 102 may function as a barrier to prevent the projection 106 from directly contacting adjacent electrodes 104, and therefore prevents diffusion of water molecules from the projection 106 into the adjacent electrodes 104.

A bond pad 124 may be formed in the same dielectric region as the plurality of electrodes 104 (e.g., the first dielectric region 102). The bond pad 124 may have an upper surface that is substantially coplanar with the upper surfaces of the electrodes 104. The bond pad 124 may be exposed for bonding with other device components in the semiconductor device or device components in another semiconductor device. For example, as shown in FIG. 1, an opening 126 may be formed in the moisture sensitive dielectric layer 108 above the first dielectric region 102 so as to expose the upper surface of the bond pad 124. An external interconnection structure, such as a wire (not shown), may be bonded, e.g., by a wire bonding process, to the exposed upper surface of the bond pad 124 for electrical connection to an external circuit. The bond pad 124 and the electrodes 104 may be made of the same material. In an embodiment, the bond pad 124 and the electrodes 104 may be made of a conductive material, such as copper.

The semiconductor device may comprise several device regions, such as a first device region 100 and a second device region 200. "Device regions" may refer to regions integrated into a semiconductor device that contains device component(s) (e.g., transistors, capacitors, diodes, etc.), and may provide specific functionalities (e.g., logic circuit, memory circuit, etc.).

As shown in FIG. 1, the projections 106 and the electrodes 104 may be located in the first device region 100, and the bond pad 124 may be located in the second device region 200. In an example, the first device region 100 may be located proximately adjacent to the second device region 200 (i.e., without other device components between the first device region 100 and the second device region 200). In other examples (not shown), the first device region 100 may be separated from the second device region 200 by other device regions.

Figure 2A:
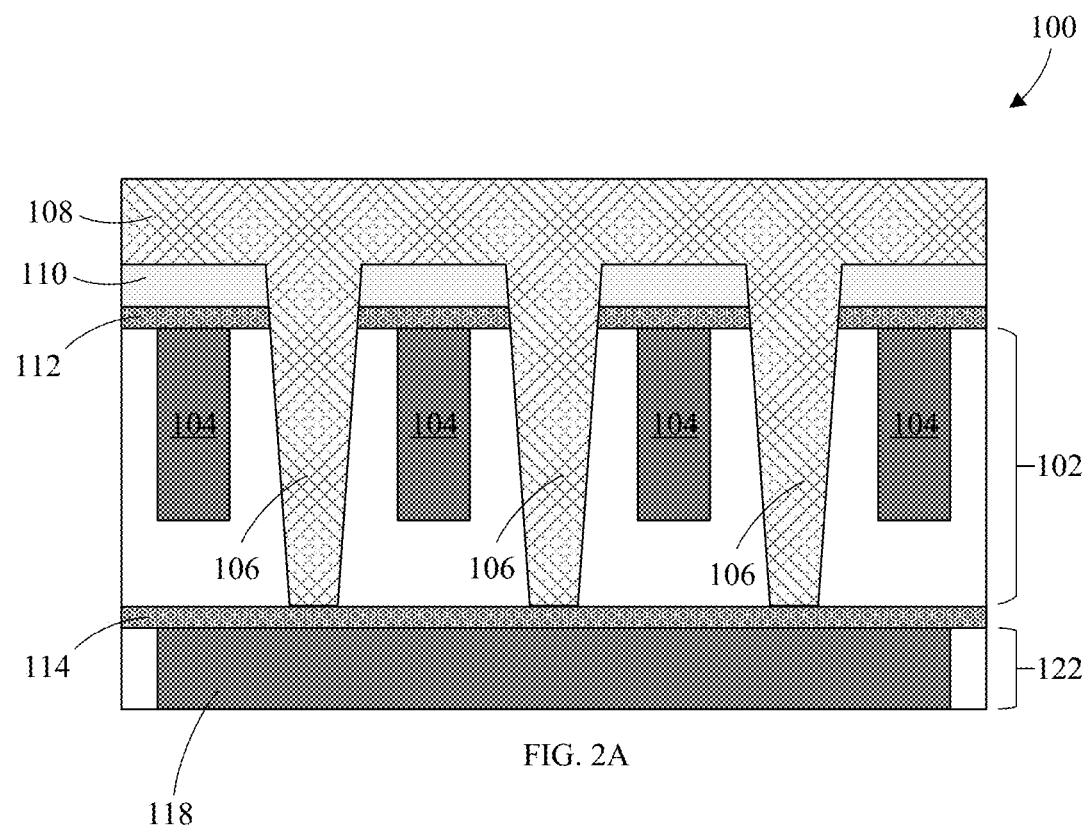
FIG. 2A to FIG. 2C are cross-sectional views depicting examples of a first device region in the semiconductor device shown in FIG. 1.

FIG. 2A illustrates an example of the first device region 100 in the semiconductor device described herein. In this example, the projections 106 may extend through the first dielectric region 102 and contact the etch stop layer 114 below the first dielectric region 102. The extension of the projections 106 through the first dielectric region 102 to contact the etch stop layer 114 below the first dielectric region 102 may advantageously increase the fringe capacitances between the two electrodes that are separated by respective ones of the projections 106, and therefore increases the sensitivity of the device.

Figure 2B:
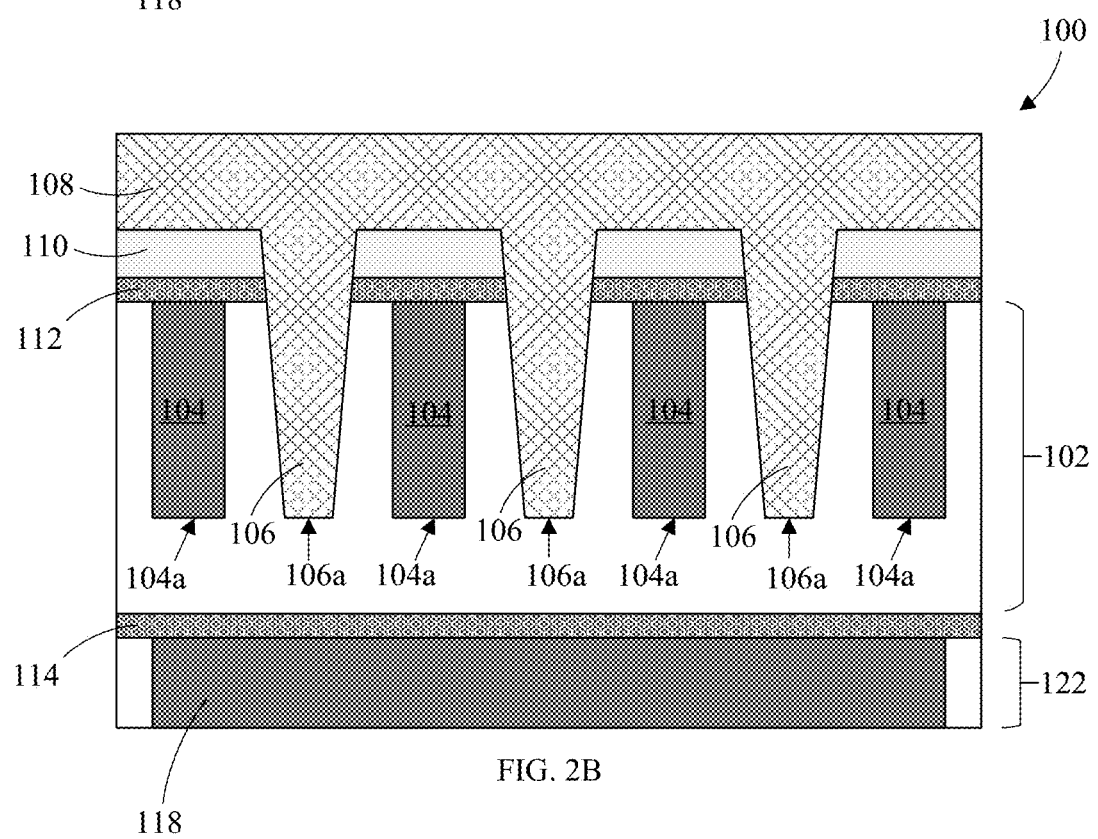

FIG. 2B illustrates another example of the first device region 100 in the semiconductor device described herein. In this example, the projections 106 may extend into the first dielectric region 102 such that a lower surface 106a of each projection 106 is substantially coplanar with a lower surface 104a of each electrode 104.

Figure 2C:
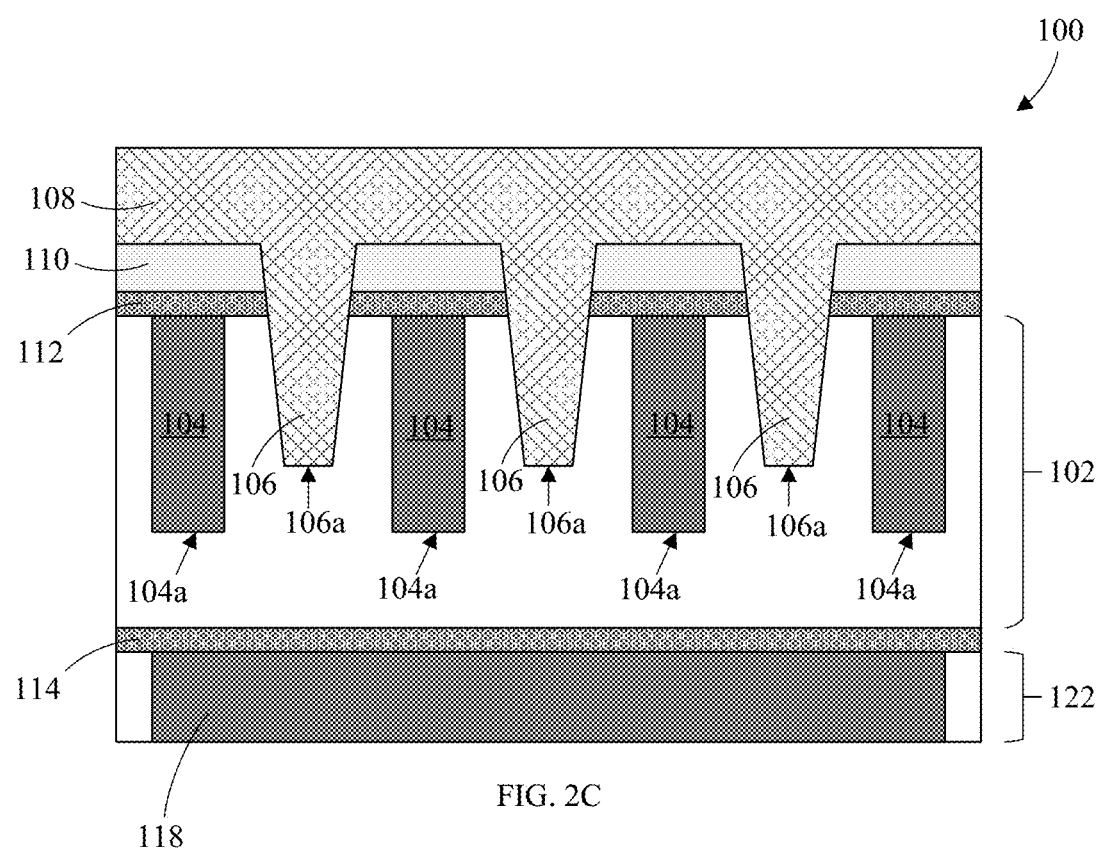

FIG. 2C illustrates yet another example of the first device region 100 in the semiconductor device described herein. In this example, the projections 106 may extend into the first dielectric region 102 such that the lower surface 106a of each projection 106 is at a level above the lower surface 104a of each electrode 104.

Figure 3A:
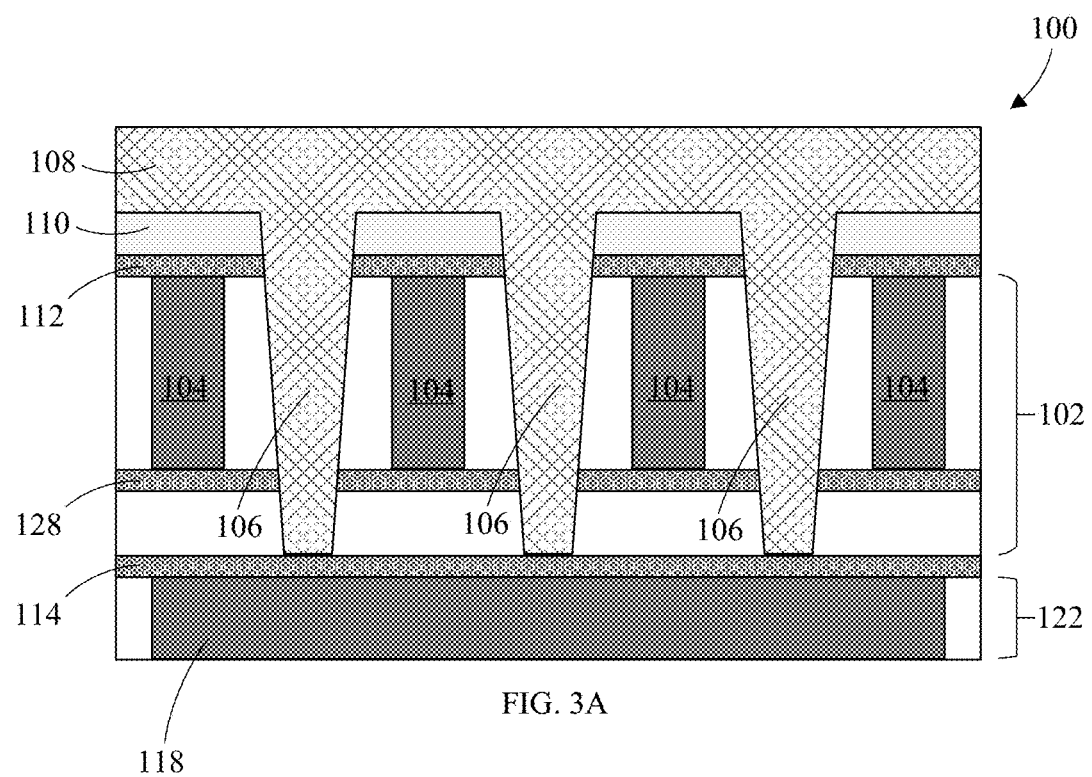
FIG. 3A to FIG. 3C are cross-sectional views depicting alternative examples of the first device region in the semiconductor device shown in FIG. 1.
Figure 3B:
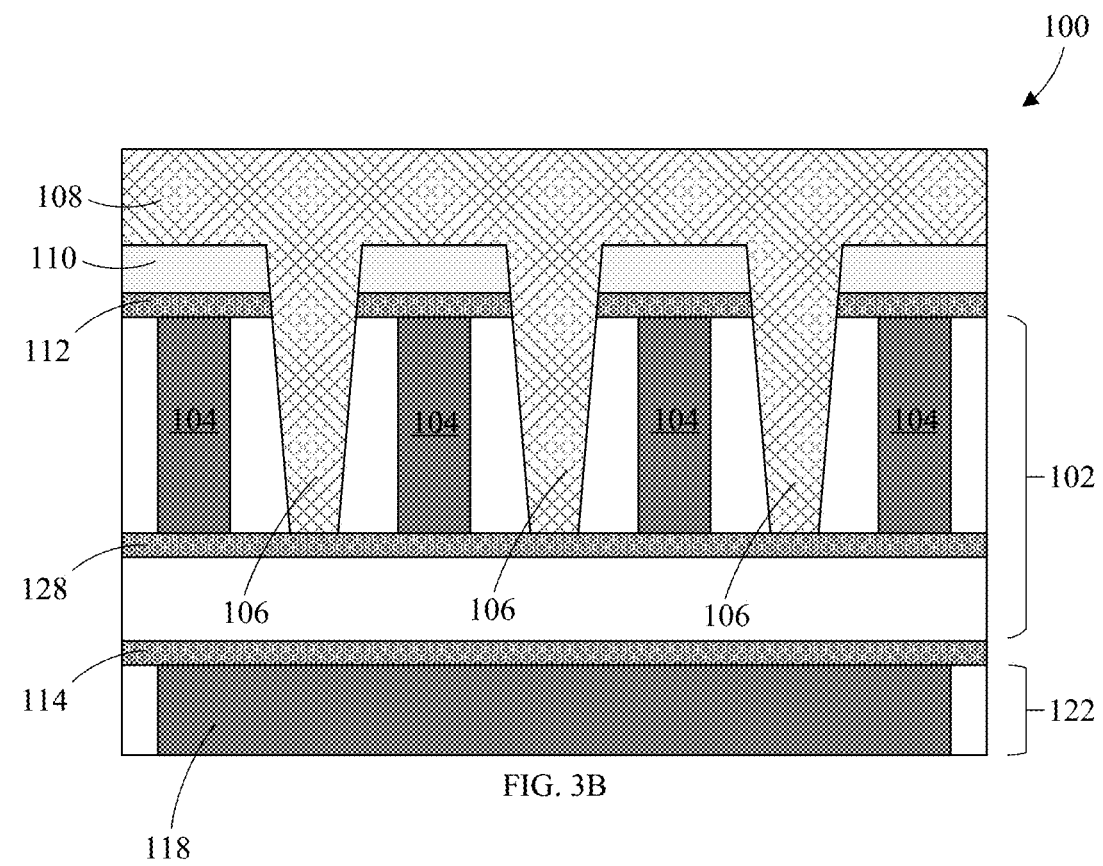
Figure 3C:
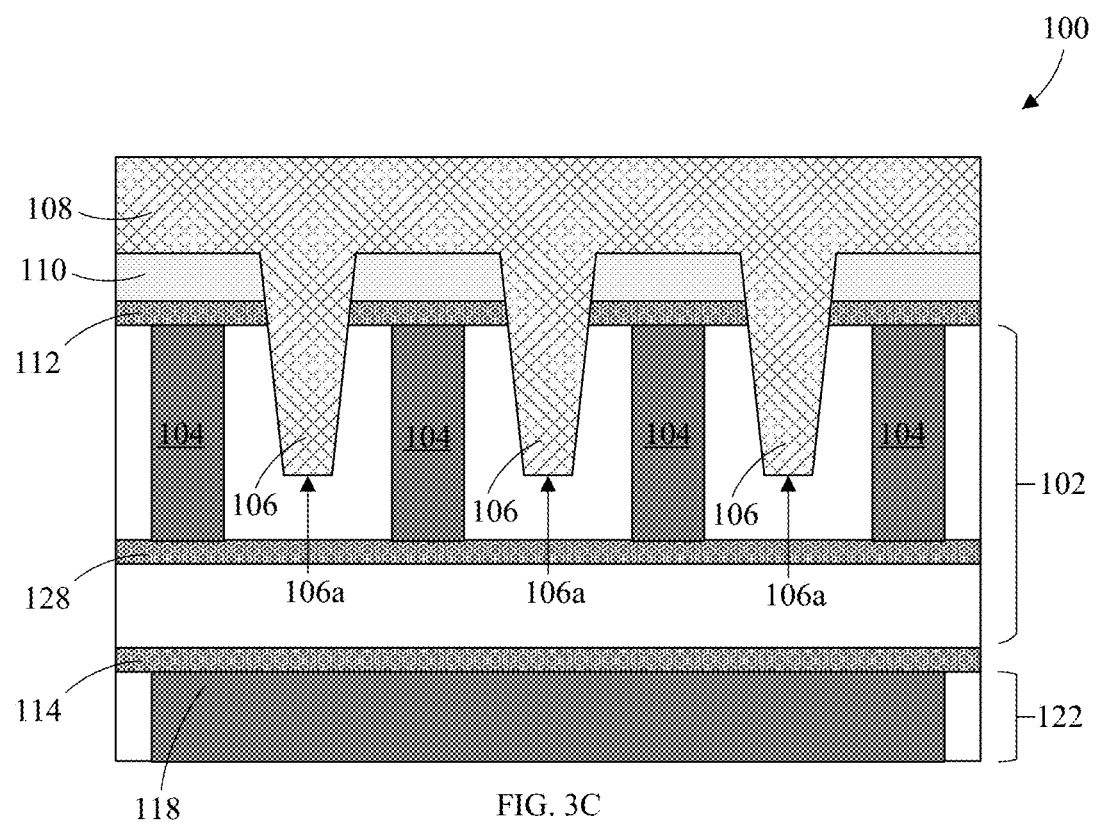

FIG. 3A, FIG. 3B, and FIG. 3C illustrate other examples of the first device region 100 in the semiconductor device described herein. As shown in FIGS. 3A through 3C, the semiconductor device may further comprise a first etch stop layer 114 below the first dielectric region 102 and a second etch stop layer 128 within the first dielectric region 102. The plurality of electrodes 104 may have lower surfaces that are disposed upon the second etch stop layer 128. Advantageously, the presence of the second etch stop layer 128 in the first dielectric region 102 may allow the formation of uniformly sized electrodes 104, thereby increasing sensing accuracy of the device.

In the example shown in FIG. 3A, the projections 106 may extend through the second etch stop layer 128 and the first dielectric region 102 to contact the first etch stop layer 114. The extension of the projections 106 through the first dielectric region 102 to contact the etch stop layer 114 below the first dielectric region 102 may advantageously increase the fringe capacitances between the two electrodes that are separated by respective ones of the projections 106, and therefore increases the sensitivity of the device.

In the example shown in FIG. 3B, the projections 106 may extend into the first dielectric region 102 and terminate on contact with the second etch stop layer 128. In the example shown in FIG. 3C, the projections 106 may extend into the first dielectric region 102 such that the lower surface 106a of each projection 106 is above and spaced apart from the second etch stop layer 128.

FIGS. 4 through 9 show example structures associated with steps that may be used to create the semiconductor devices as described above.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" includes deposition of material or photoresist, patterning, exposure, development, etching, cleaning, and/or removal of the material or photoresist as required in forming a described pattern, structure, or opening. Examples of techniques for patterning include, but not limited to, wet etch lithographic processes, dry etch lithographic processes, or direct patterning processes. Such techniques may use mask sets and mask layers.

Figure 4:
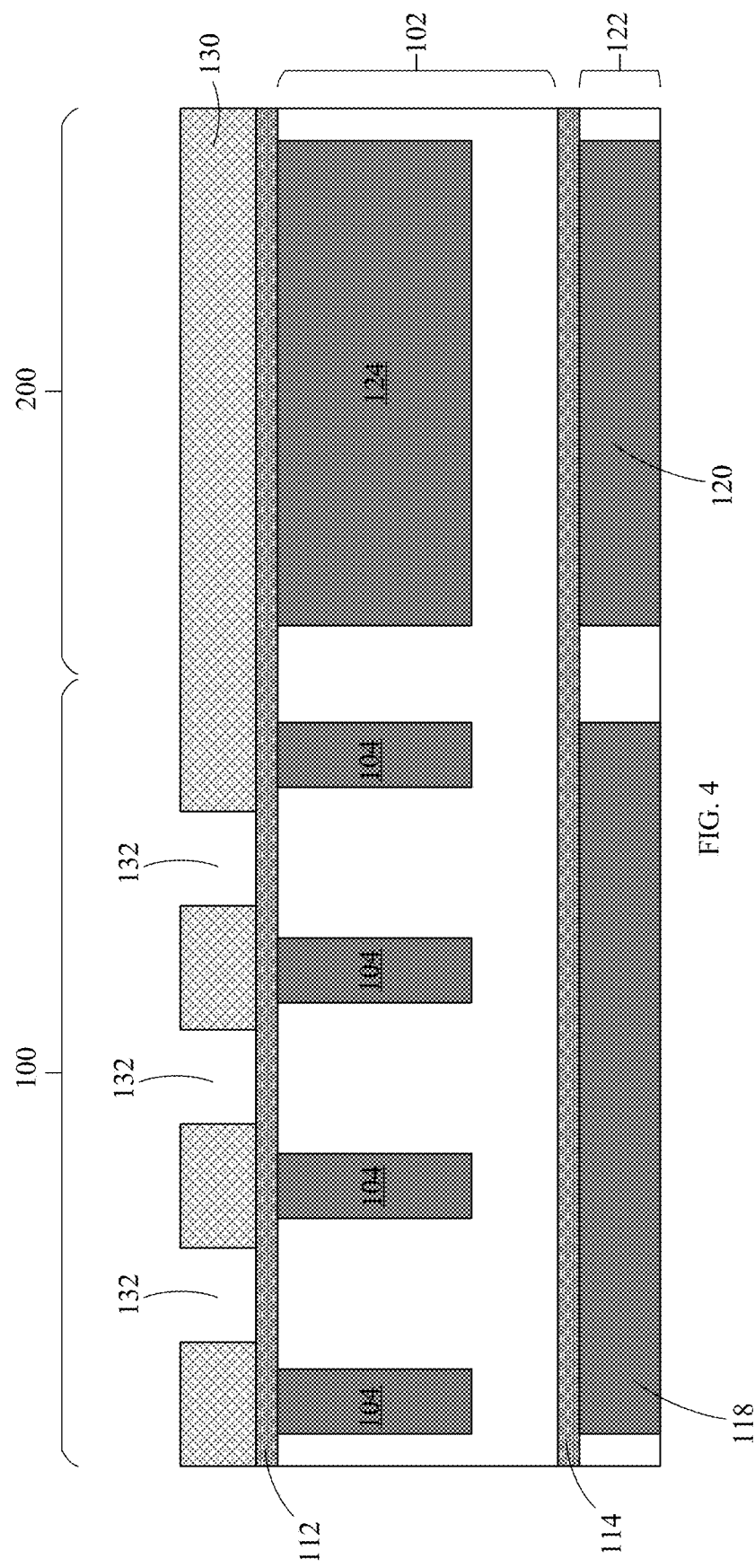
FIG. 4 to FIG. 9 are cross-sectional views depicting structures of a semiconductor device at various stages of forming the semiconductor device.

Referring to FIG. 4, an example structure for use in fabricating the semiconductor devices of the present disclosure is shown. The structure may have a first device region 100 and a second device region 200. A plurality of electrodes 104 and a bond pad 124 are formed in a first dielectric region 102, in which the plurality of electrodes 104 may be located in the first device region 100 and the bond pad 124 may be located in the second device region 200. The formation of the electrodes 104 and the bond pad 124 may include a dual damascene process. The first dielectric region 102 may be formed above a second dielectric region 122, with an etch stop layer 114 being formed between the first dielectric region 102 and the second dielectric region 122. In some examples, a second etch stop layer (not shown in FIG. 4) may be formed within the first dielectric region 102.

The electrodes 104 may be formed to have an upper surface that is substantially coplanar with an upper surface of the bond pad 124. A passivation layer 112 may be formed on the upper surfaces of the electrodes 104 and the upper surface of the bond pad 124 using deposition techniques described herein. A first patterned mask layer 130 may be formed upon the passivation layer 112. For example, the mask layer 130 may be deposited on the passivation layer 112 using spin-on coating, and may be patterned using patterning techniques to define openings 132 in the mask layer 130 that are located in the first device region 100.

Figure 5:
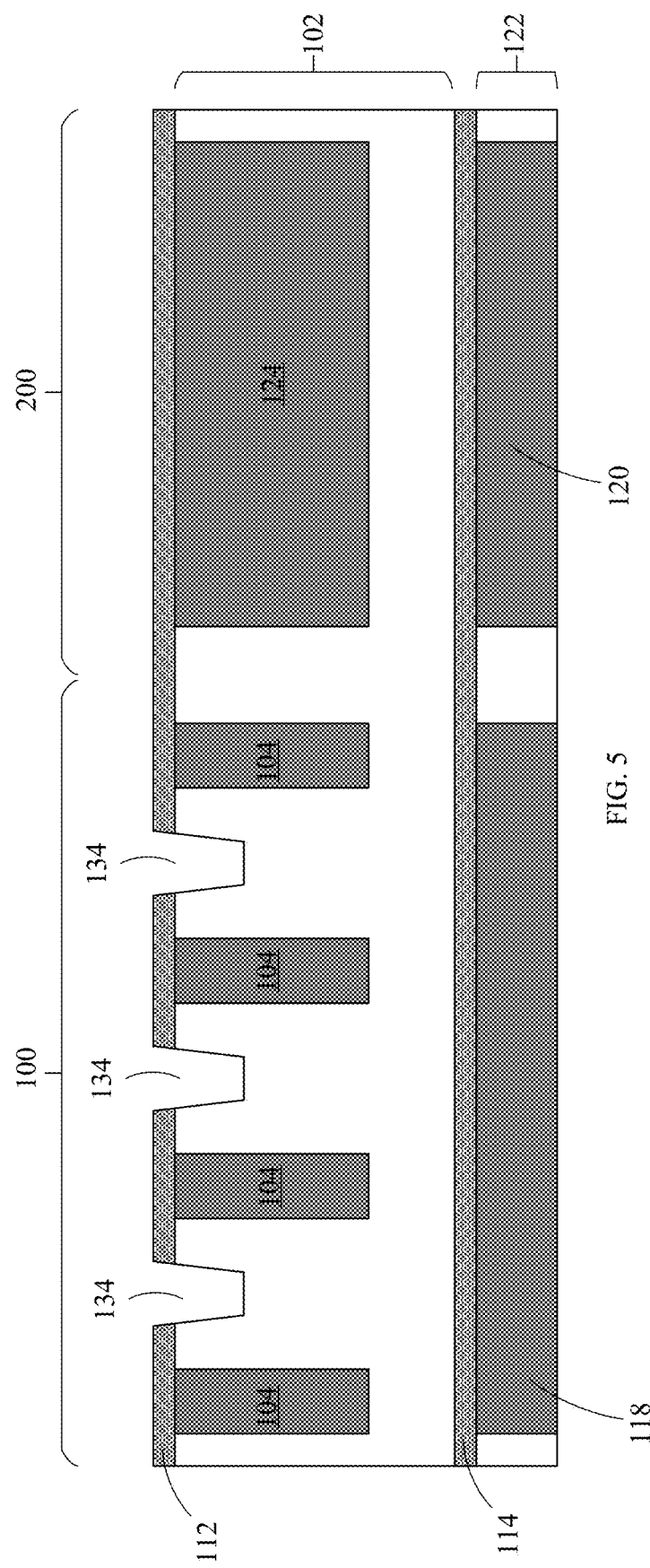

Referring to FIG. 5, a plurality of recesses 134 may be formed in the first device region 100. As shown, each recess 134 may be formed in the first dielectric region 102 and between two electrodes in the plurality of electrodes 104. For example, the passivation layer 112 and the first dielectric region 102 may be patterned using the patterned mask layer 130 and the patterning techniques described herein. The patterned mask layer 130 may be removed thereafter, for example, by an ashing step.

Figure 6:
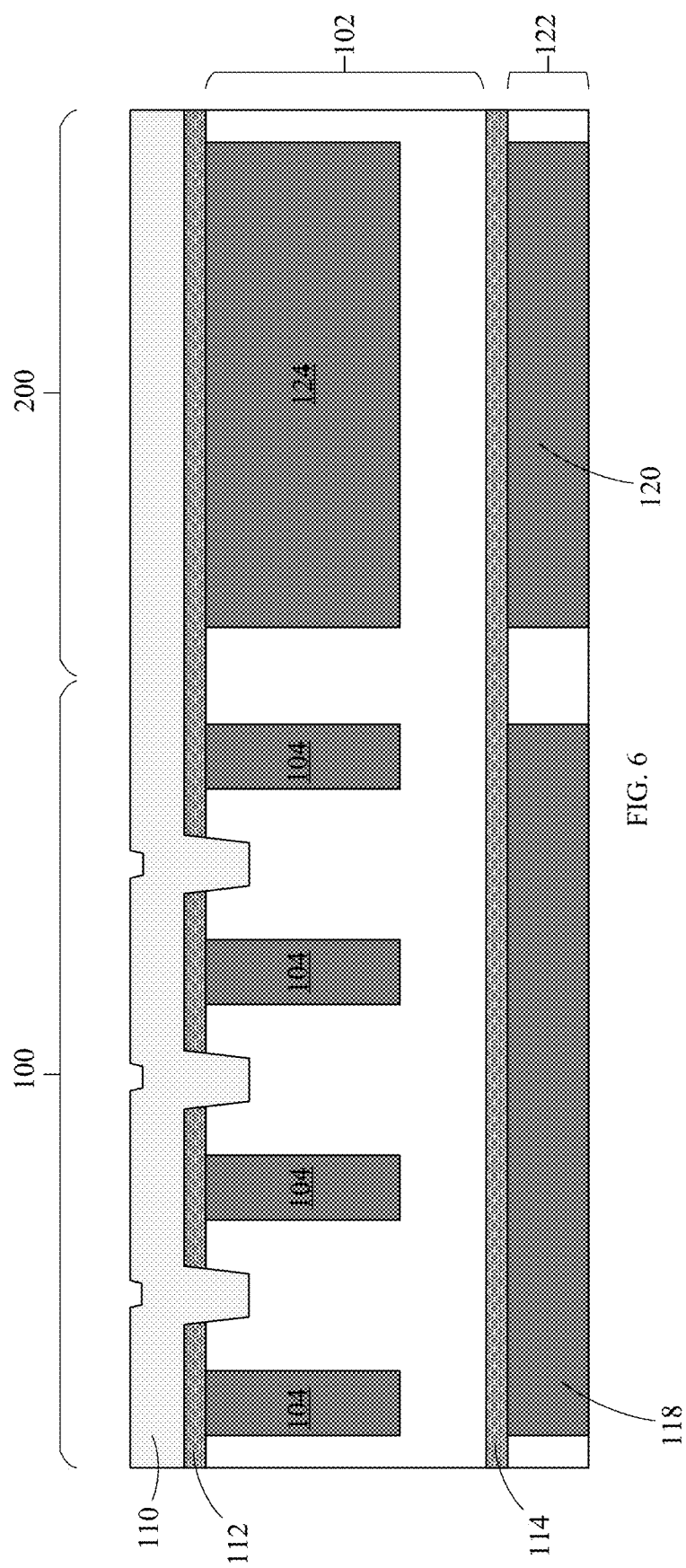

Referring to FIG. 6, a barrier layer 110 may be formed over the electrodes 104 and the bond pad 124. The barrier layer 110 may be deposited on the passivation layer 112 using the deposition techniques described herein. Preferably, a conformal deposition process (e.g., ALD) may be used to deposit the barrier layer 110. The deposition of the barrier layer 110 also fills the recesses.

Figure 7:
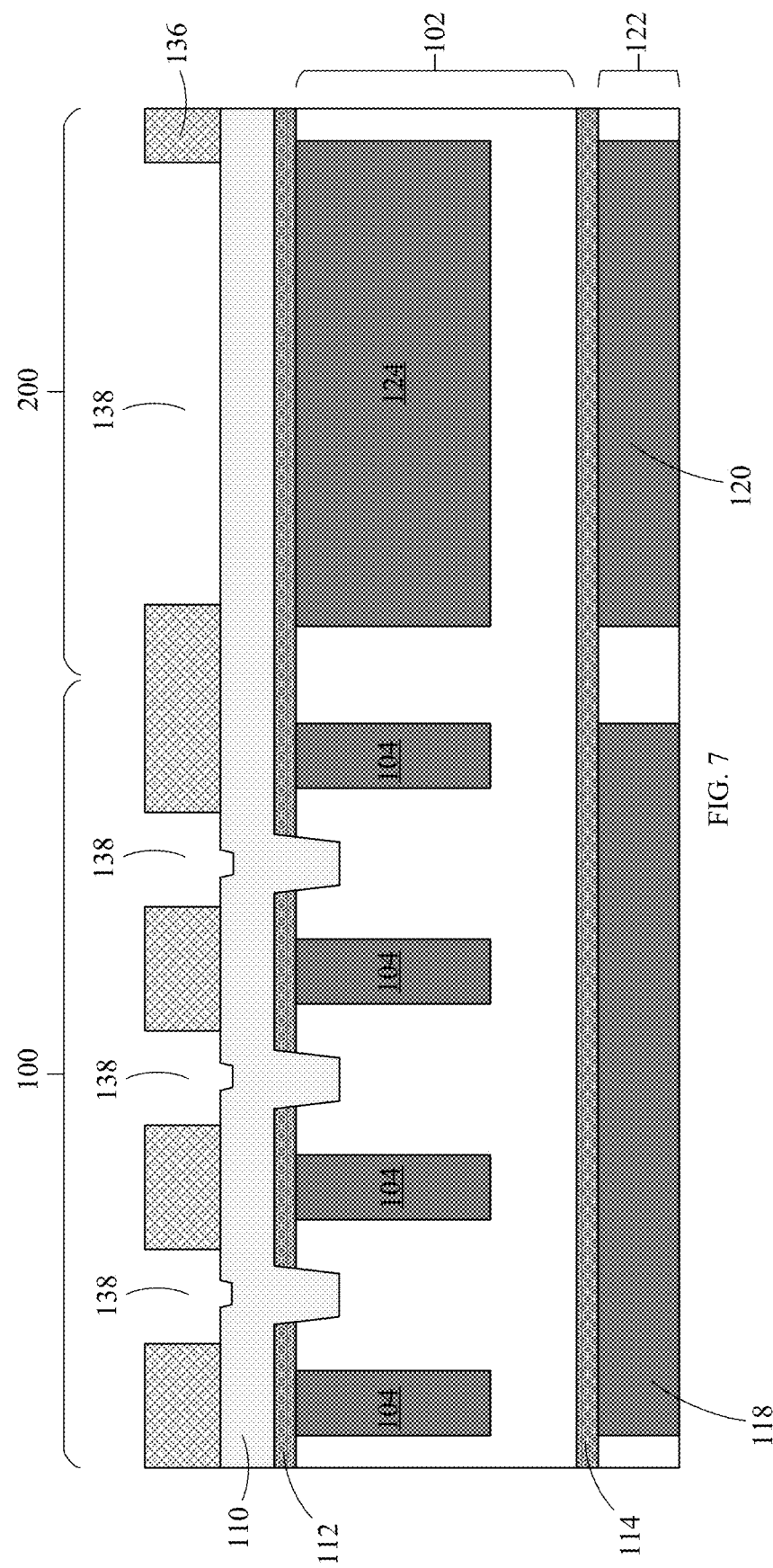

Referring to FIG. 7, a second patterned mask layer 136 may be formed upon the barrier layer 110. For example, the mask layer 136 may be deposited on the barrier layer 110 using spin-on coating, and may be patterned using patterning techniques to define openings 138 in the second mask layer 136. The openings 138 in the mask layer 136 may be formed in the first device region 100 and the second device region 200, which exposes the underlying barrier layer 110.

Figure 8:
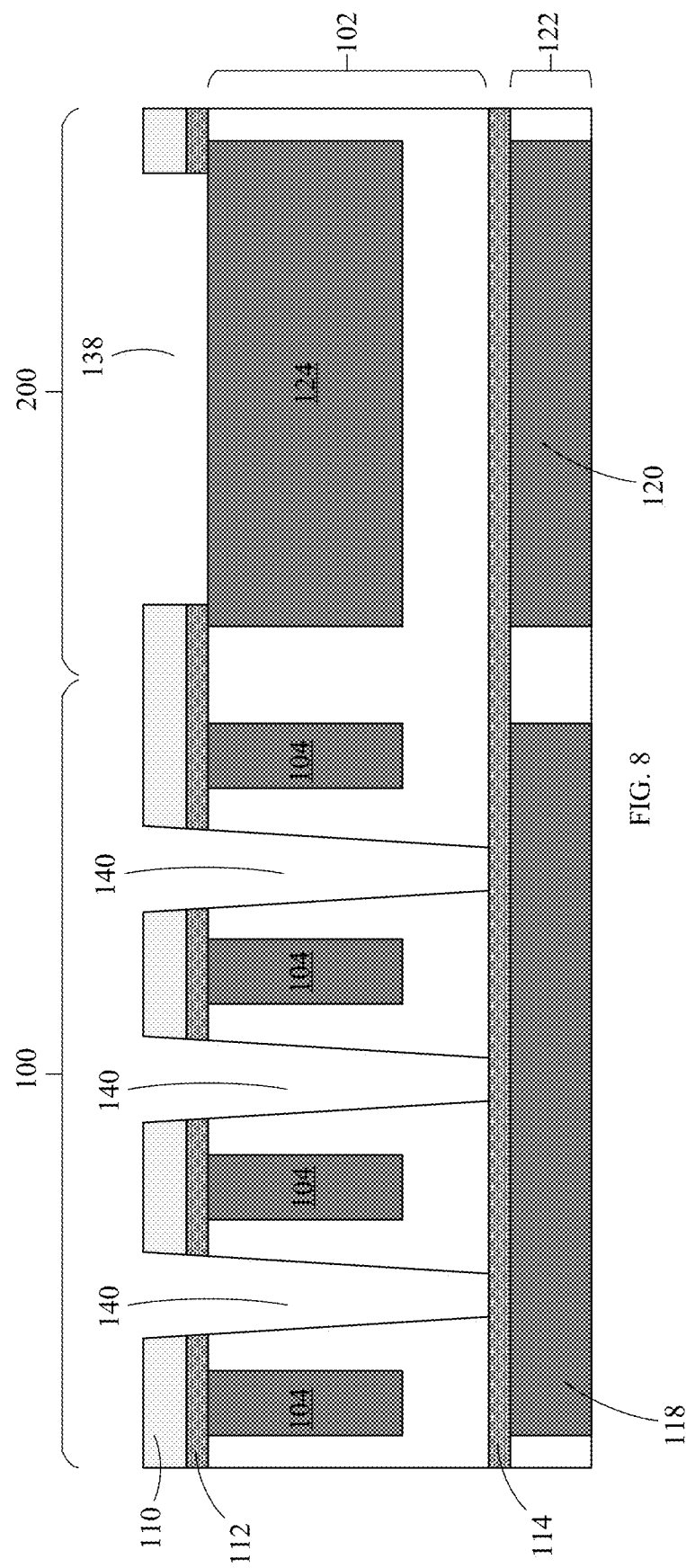

Referring to FIG. 8, a plurality of trenches 140 are formed in the first dielectric region 102 and the upper surface of the bond pad 124 is exposed. The trenches 140 may be formed in the first device region and each trench 140 may be formed between two electrodes 104. The forming of the trenches 140 and the exposing of the upper surface of the bond pad 124 may include etching the barrier layer 110 using the patterned mask layer 136. In particular, the material of the first dielectric region 102 may have the same etch selectivity as the material of the barrier layer 110 such that the forming of the trenches 140 and the exposing of the upper surface of the bond pad 124 are performed simultaneously. The exposing of the upper surface of the bond pad 124 also includes the etching of a portion of the passivation layer 112 between the barrier layer 110 and the upper surface of the bond pad 124.

As shown in FIG. 8, the formation of the trenches 140 may include etching the first dielectric region 102 until the trenches 140 contact a first etch stop layer 114 formed below the first dielectric region 102. Alternatively, the etching of the first dielectric region 102 may be stopped when a bottom of each trench 140 is either substantially coplanar with, or above, a bottom surface of each electrode 104. In other examples, the formation of the trenches 140 may additionally include etching through a second etch stop layer (not shown) formed within the first dielectric region 102.

Advantageously, the simultaneous formation of trenches in the first dielectric region 102 and exposure of the bond pad 124 may enable the fabrication of a sensor to be integrated into the back-end-of-line processing of a semiconductor device, without requiring the sensor to be fabricated separately from the semiconductor device, thereby reducing manufacturing cost.

Figure 9:
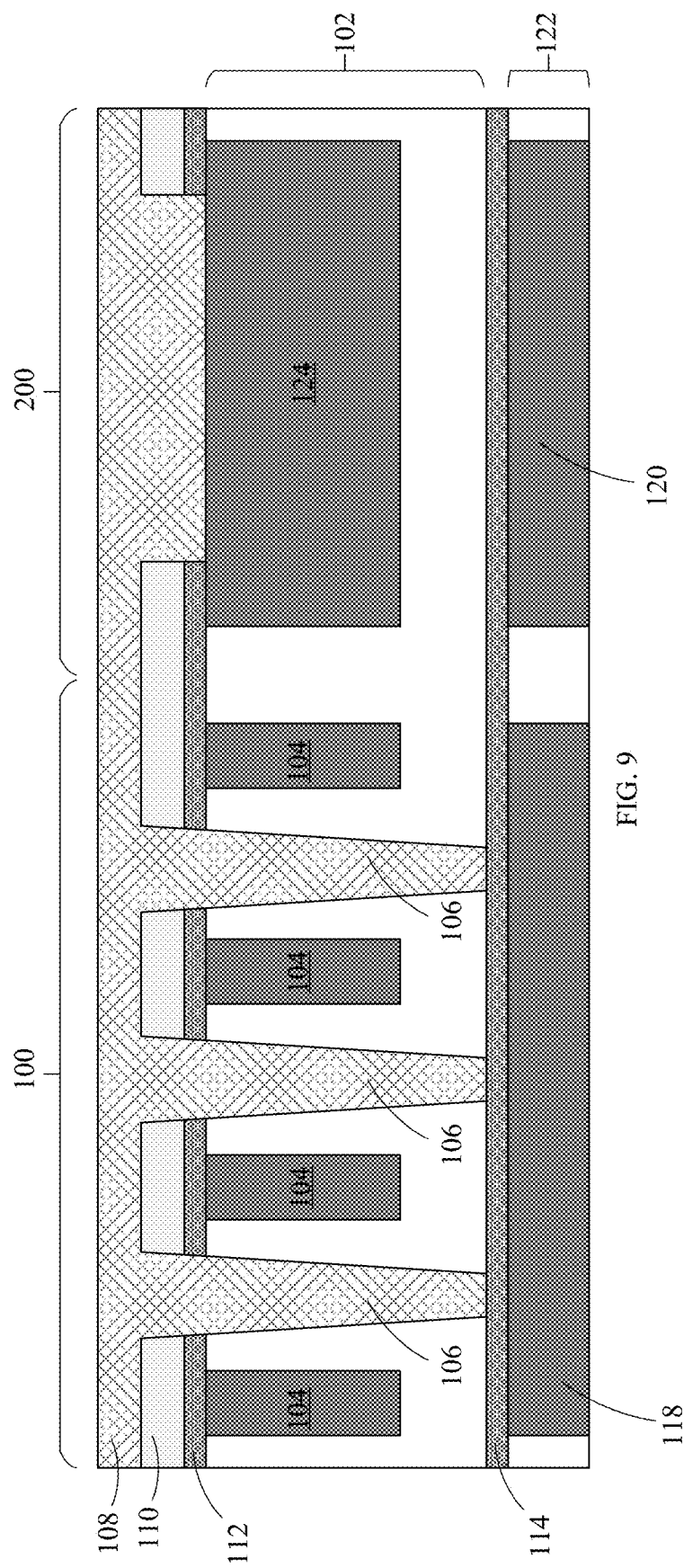

Referring to FIG. 9, a moisture sensitive dielectric layer 108 is formed on the barrier layer 110 and the exposed upper surface of the bond pad 124. The forming of the moisture sensitive dielectric layer 108 may be performed using the deposition techniques described herein. The forming of the moisture sensitive dielectric layer 108 also fills the trenches 140 to form a plurality of projections 106, and each projection 106 is formed between two electrodes in the plurality of electrodes 104. Subsequently, a portion of the moisture sensitive dielectric layer 108 in the second device region 200 may be etched so as to expose the upper surface of the bond pad 124, using the patterning techniques described herein.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the disclosed semiconductor devices and methods of forming the same may be employed in manufacturing a variety of different integrated circuit products, including, but not limited to, memory cells, non-volatile (NV) memory devices, FinFET transistor devices, CMOS devices, etc.

What is claimed is:

1. A method of forming a semiconductor device, the method comprising:
forming a plurality of electrodes and a bond pad in a dielectric region, wherein the plurality of electrodes is located in a first device region and the bond pad is located in a second device region;
forming a passivation layer on each electrode in the plurality of electrodes and the bond pad;
forming a barrier layer on the passivation layer;
forming a plurality of trenches that extend through the barrier layer and into the dielectric region, the forming of the trenches simultaneously exposing an upper surface of the bond pad; and
forming a moisture sensitive dielectric layer on the barrier layer, wherein the forming of the moisture sensitive dielectric layer also fills the trenches to form a plurality of projections, each projection being formed between two electrodes in the plurality of electrodes.

2. The method of claim 1, further comprising:
forming a plurality of recesses by patterning the passivation layer on the electrodes, wherein each recess is formed in the dielectric region and between two electrodes in the plurality of electrodes;
forming the barrier layer to fill the recesses.

3. The method of claim 2, wherein the forming of the trenches includes simultaneously etching the dielectric region and the barrier layer, and wherein the dielectric region has a material with the same etch selectivity as the barrier layer.

4. The method of claim 3, wherein the upper surface of the bond pad is exposed by etching the passivation layer and the barrier layer.

5. The method of claim 4, further comprising etching the moisture sensitive dielectric layer to expose the upper surface of the bond pad.

6. The method of claim 3, wherein the forming of the trenches includes etching the dielectric region until bottom surfaces of the trenches contact an etch stop layer formed below the dielectric region.

7. The method of claim 6, wherein the trenches are formed within the first device region.

8. The method of claim 1, wherein the electrodes are formed to have an upper surface that is substantially coplanar with the upper surface of the bond pad.

9. The method of claim 8, wherein the electrodes and the bond pad are formed in the dielectric region using a dual damascene process.

10. The method of claim 1, wherein the moisture sensitive dielectric layer extends over each electrode in the plurality of electrodes.

* * * * *